(12) United States Patent
Wu

(10) Patent No.: US 6,265,263 B1
(45) Date of Patent: Jul. 24, 2001

(54) METHOD FOR FORMING A DRAM CAPACITOR WITH POROUS STORAGE NODE AND RUGGED SIDEWALLS

(75) Inventor: Shye-Lin Wu, Hsinchu (TW)

(73) Assignee: Texas Instruments - Acer Incorporated, Hsinchu (TW)

( * ) Notice: Subject to any disclaimer, the term of this patent is extended or adjusted under 35 U.S.C. 154(b) by 0 days.

(21) Appl. No.: 09/293,454

(22) Filed: Apr. 16, 1999

Related U.S. Application Data

(63) Continuation-in-part of application No. 09/025,968, filed on Feb. 19, 1998, now abandoned.

(51) Int. Cl.⁷ ...................... H01L 21/8242; H01L 21/336
(52) U.S. Cl. .......................... 438/255; 438/239; 438/253; 438/396
(58) Field of Search ..................... 438/239, 255, 438/459, 151, 400, 253, 396, 964, 398, FOR 126, FOR 208, FOR 426

(56) References Cited

U.S. PATENT DOCUMENTS

| | | | |
|---|---|---|---|
| 5,213,992 | * | 5/1993 | Lu .......................................... 438/398 |
| 5,342,800 | * | 8/1994 | Jun ........................................ 438/396 |
| 5,350,707 | * | 9/1994 | Ko et al. ............................... 438/396 |
| 5,480,824 | * | 1/1996 | Jun ........................................ 438/396 |
| 5,616,511 | * | 4/1997 | Hirota ................................... 438/396 |
| 5,670,405 | * | 9/1997 | Tseng .................................... 438/253 |
| 5,766,995 | * | 6/1998 | Wu ........................................ 438/255 |
| 5,789,290 | * | 8/1998 | Sun ....................................... 438/253 |
| 5,795,806 | * | 8/1998 | Tseng .................................... 438/255 |
| 5,817,554 | * | 10/1998 | Tseng .................................... 438/253 |
| 5,869,368 | * | 2/1999 | Yew et al. ............................. 438/255 |
| 5,981,336 | * | 11/1999 | Chern .................................... 438/253 |
| 6,051,464 | * | 4/2000 | Chen et al. ........................... 438/255 |

FOREIGN PATENT DOCUMENTS

02000114472 * 4/2000 (JP) ....................................... 27/108

* cited by examiner

*Primary Examiner*—Charles Bowers
*Assistant Examiner*—Brook Kebede

(57) ABSTRACT

The method for forming a DRAM capacitor can include the following steps. First, a first dielectric layer is formed on a semiconductor substrate, followed by the formation of a second dielectric layer on the first dielectric layer, and the formation of a third dielectric layer on the second dielectric layer. Next, the first, second, and third dielectric layers are patterned to form a contact hole therein. A doped polysilicon layer is then formed within the contact hole and over the third dielectric layer, followed by the formation of a fourth dielectric layer over the doped polysilicon layer. A patterning step patterns the fourth dielectric layer and the doped polysilicon layer to define a storage node. A hemispherical grained silicon layer is then formed on the fourth dielectric layer, on sidewalls of the storage node, and on the third dielectric layer. The hemispherical grained silicon layer is etched to define a plurality of cavities between grains of the hemispherical grained silicon layer and to expose the fourth dielectric layer through the plurality of cavities. The fourth dielectric layer and the doped polysilicon layer underlying the cavities are then etched to form a porous storage node. The fourth dielectric layer and the third dielectric layer are removed, followed by the formation of a fifth dielectric layer on the porous storage node and the substrate. Finally, a conductive layer is formed on the fifth dielectric layer.

12 Claims, 4 Drawing Sheets

METHOD FOR FORMING A DRAM CAPACITOR WITH POROUS STORAGE NODE AND RUGGED SIDEWALLS

CROSS REFERENCE TO RELATED APPLICATIONS

This invention is a continuation-in-part application filed under the title of "DRAM CELL WITH A MULTIPLE PILLAR-SHAPED CAPACITOR" with the Ser. No. of 09/025,968, filed on Feb. 19, 1998, now abandoned, which is assigned to the same assignee with the same inventor as the present application.

BACKGROUND OF THE INVENTION

1. Field of the Invention

The present invention relates to dynamic random access memory (DRAM) fabrication, and more particularly, to a method for forming a DRAM capacitor with porous storage node and rugged sidewalls.

2. Description of the Prior Art

The increasing popularity of electronic equipment, such as computers for example, is increasing the demand for large semiconductor memories. FIG. 1 shows a simplified diagram of the organization of a typical large semiconductor memory 14. The storage cells of the memory 14 are arranged to an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

Row address 10 and column address 12 are used to identify a location in the memory 14. A row address buffer 15 and a column address buffer 17, respectively, receive row address 10 signals and column address 12 signals. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration " (VLSI) or "ultra large scale integration (ULSI) ICs. For example, the memory 14 can be a dynamic random access memory (DRAM). The DRAM has become one of the most widely used types of semiconductor memory due to its low cost per bit, high device density and flexibility of use concerning reading and writing operations.

Early DRAMs used storage cells each consisting of three transistors and were manufactured using P type channel metal-oxide-semiconductor (PMOS) technology. Later, a DRAM storage cell structure consisting of one transistor and one capacitor was developed. A circuit schematic diagram corresponding to this structure is shown in FIG. 2A. The gate of the transistor 20 is controlled by a word line signal, and data, represented by the logic level of a capacitor voltage, is written into or read out of the capacitor 22 through a bit line. FIG. 2B shows the cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ratio in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the storage capacitance while maintaining the small area occupied on the substrate surface. Consequently, this type of capacitor has come to be widely used in DRAM devices.

SUMMARY OF THE INVENTION

In accordance with the present invention, a method is provided for forming a porous storage node with rugged sidewalls for a dynamic random access memory cell that substantially increases the surface area of the capacitor.

In the preferred embodiment of the present invention, a first dielectric layer is firstly formed on a semiconductor substrate, followed by the formation of a second dielectric layer on the first dielectric layer, and the formation of a third dielectric layer on the second dielectric layer. Next, the first, second, and third dielectric layers are patterned to form a contact hole therein. A doped polysilicon layer is then formed within the contact hole and over the third dielectric layer, followed by the formation of a fourth dielectric layer over the doped polysilicon layer. A patterning step patterns the fourth dielectric layer and the doped polysilicon layer to define a storage node. A hemispherical grained silicon layer is then formed on the fourth dielectric layer, on sidewalls of the storage node, and on the third dielectric layer. The hemispherical grained silicon layer is etched to define a plurality of cavities between grains of the hemispherical grained silicon layer and to expose the fourth dielectric layer through the plurality of cavities. The fourth dielectric layer and the doped polysilicon layer underlying the cavities are then etched to form a porous storage node. The fourth dielectric layer and the third dielectric layer are removed, followed by the formation of a fifth dielectric layer on the porous storage node and the substrate. Finally, a conductive layer is formed on the fifth dielectric layer.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DESCRIPTION OF THE PREFERRED EMBODIMENTS

Figure 1:
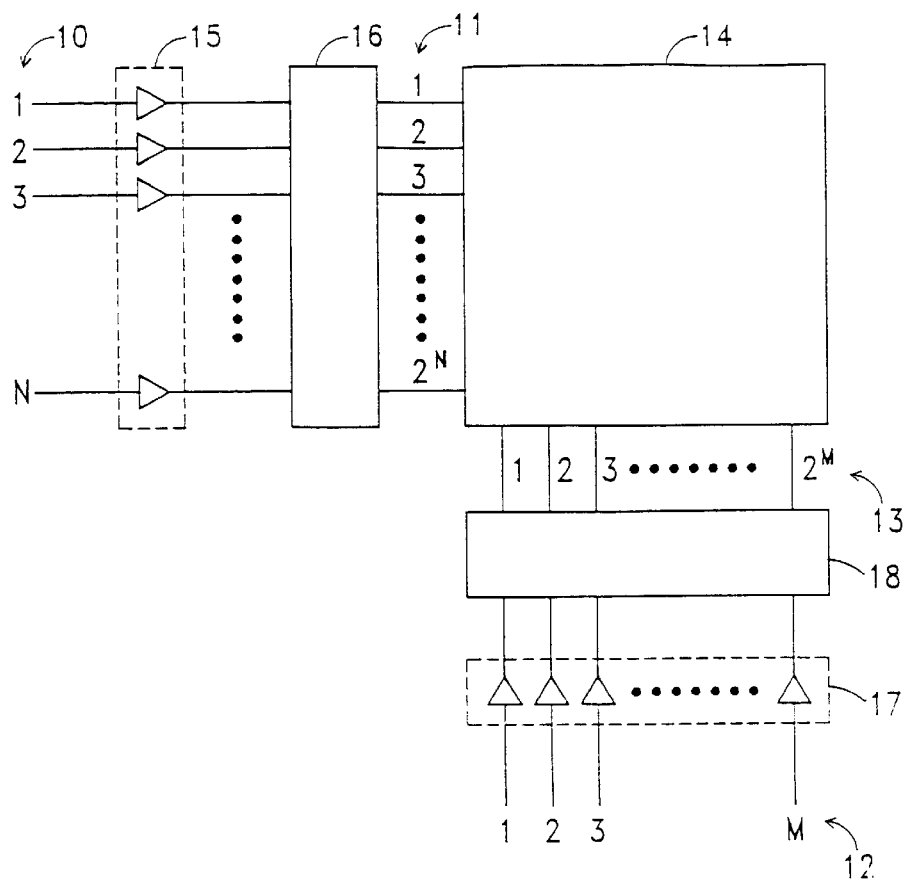
FIG. 1 shows a simplified diagram illustrative of the organization of a typical large semiconductor memory.
Figure 2A:
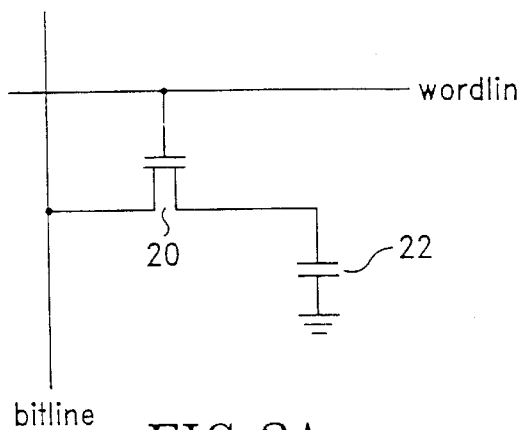
FIG. 2A shows a circuit schematic diagram of a typical one-transistor dynamic random access memory (DRAM) cell.
Figure 2B:
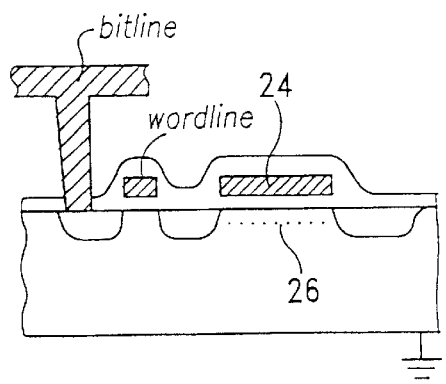
FIG. 2B shows a cross-sectional view illustrative of traditional one-transistor DRAM storage cell.
Figure 3:
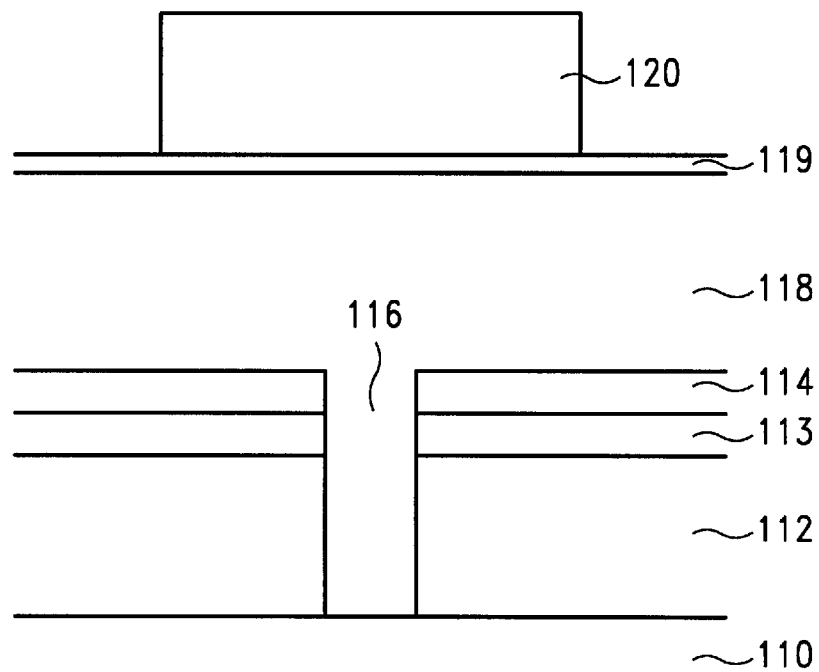
FIG. 3 shows a cross-sectional view illustrative of forming first, second, third dielectric layers, a doped polysilicon layer and a fourth dielectric layer in accordance with the present invention.

FIG. 3 shows a cross-sectional view illustrative of a portion of a dynamic random access memory (DRAM) cell in accordance with one embodiment of the present invention, wherein a first dielectric layer 112, such as tetraethylorithosilicate deposited silicon oxide (TEOS-oxide) or boro-phosphosilicate glass (BPSG), is deposited on a semiconductor substrate 110, in order to serve as the main insulation layer between conductive layers or conductive regions. A second dielectric layer 113 is then formed on the first dielectric layer 112. In the preferred embodiments, the second dielectric layer 113 is a silicon nitride layer which serves as an etch-stop layer in later processes. The silicon nitride layer can be formed with a typical chemical vapor deposition (CVD) method.

A third dielectric layer 114, such as a silicon oxide layer in this case, is then deposited on the second dielectric layer 113. In this embodiment, the silicon oxide layer is deposited using a conventional low pressure chemical vapor deposition (LPCVD) process or a conventional plasma enhanced chemical vapor deposition (PECVD) process.

The third dielectric layer 114, the second dielectric layer 113, and the first dielectric layer 112 are then patterned to form a contact hole 116 within the three dielectric layers. The contact hole 116 is communicated to an underlying conductive region located on or within a portion of the substrate 110, such as a source region, to make conductive connections.

A doped polysilicon layer 118 is then formed on the third dielectric layer 114, therefore filling the contact hole 116. In this embodiment, the polysilicon layer 118 is deposited using a typical chemical vapor deposition process to a thickness of about 3000–7000 angstroms above the surface of the third dielectric layer 114. A fourth dielectric layer 119 is then formed over the doped polysilicon layer 118. In the preferred embodiments, the fourth dielectric layer 119 is a silicon oxide layer which is formed either with chemical vapor deposition onto the doped polysilicon layer 118 or with thermal oxidation to grow from the doped polysilicon layer 118. The fourth dielectric layer 119 of silicon oxide is about 100 to 500 angstroms in this case.

Figure 4:
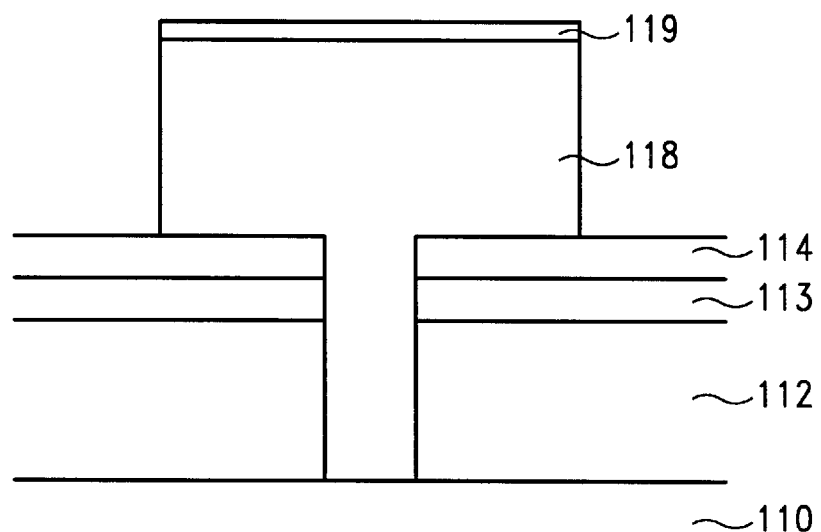
FIG. 4 shows a cross-sectional views illustrative of defining a storage node in accordance with the present invention.

A photoresist layer 120 is then formed and patterned on the fourth dielectric layer 119 using conventional lithography processes, in order to define a storage node region of the fourth dielectric layer 119 and the doped polysilicon layer 118 as shown in FIG. 3. Turning to FIG. 4, the fourth dielectric layer 119 and the doped polysilicon layer 118 is then patterned using the photoresist layer 120 as a mask. After the processing of one or more etch steps, the storage node is then defined as shown in FIG. 4 and the photoresist layer 120 is removed after the etch process.

Figure 5:
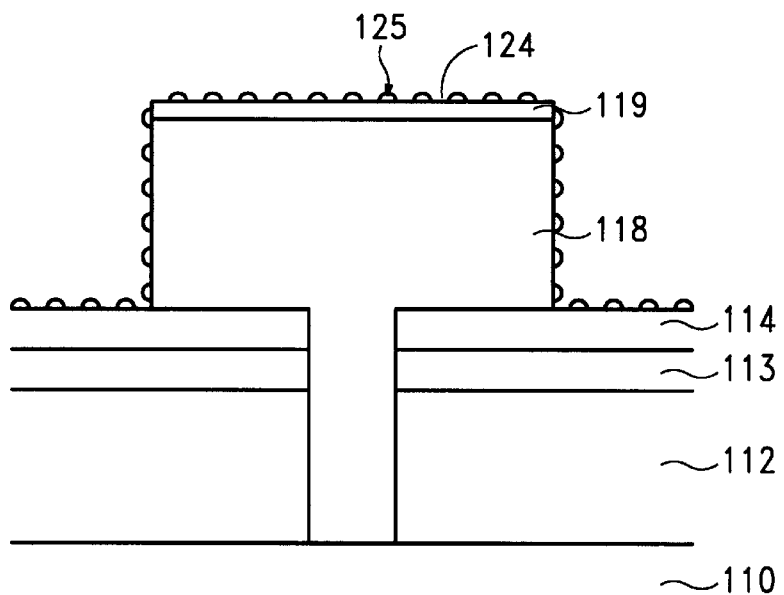
FIG. 5 shows a cross-sectional view illustrative of forming an HSG layer in accordance with the present invention.

Referring to FIG. 5, a hemispherical grained (HSG) silicon layer 124 is then deposited on the fourth dielectric layer 119, on sidewalls of the storage node, and on the third dielectric layer 114. The hemispherical grained silicon layer 124 is deposited to have a thickness of about 200 to 1000 angstroms and grain size ranging from about 200 to 1000 angstroms in the case.

In the preferred embodiments of forming hemispherical grained silicon layer 124, a seed layer may be needed for the formation of grained silicon. A thin titanium nitride (TiN) layer can be conformably formed on the fourth dielectric layer 119, on sidewalls of the storage node, and on the third dielectric layer 114 with suitable processes. In this embodiment, a low pressure chemical vapor deposition (LPCVD) is preferably used to achieve excellent conformity and thickness controllability. The TiN layer is preferably deposited to a thickness between about 100 to 300 angstroms, while the thickness can range from about 50 to 1000 angstroms in different cases.

Having the TiN layer as a seed layer, the nucleation sites in forming the HSG silicon layer 124 are provided. In the case without employing the TiN layer, silicon, silicon oxide or other particles can also be employed as the nucleation sites in the conventional techniques for forming the HSG layer 124. During the formation of the HSG silicon layer 124 in accordance with the embodiment of the present invention, deposited HSG polysilicon nucleates on the surface of the seed layer, or in the gas phase, to form a great number of polysilicon nodules over the surface of the substrate, such as on the fourth dielectric layer 119, on sidewalls of the storage node, and on the third dielectric layer 114. While the polysilicon deposition is continued further, these nodules grow to become grains as shown in FIG. 5. It is noted that a low temperature of about 250° C. to 350° C. is sufficient to form the HSG silicon layer 124, for example, using plasma enhanced chemical vapor deposition (PECVD) in the preferred embodiment. A higher temperature of about 500–650° C. may be necessary in forming HSG silicon using the conventional technique, such as low pressure chemical vapor deposition (LPCVD).

Figure 6:
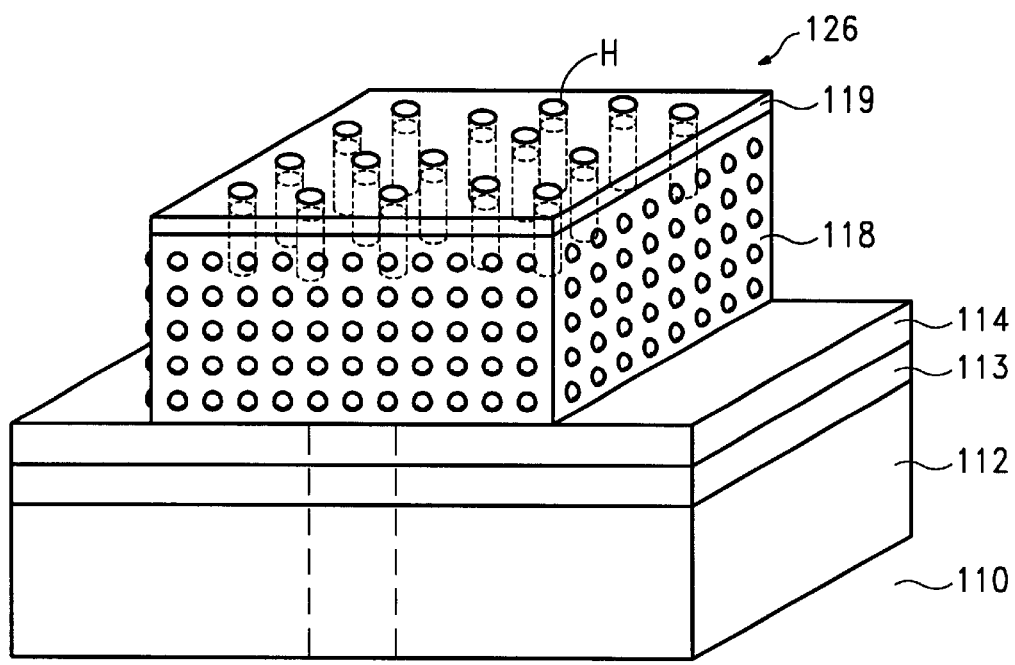
FIG. 6 shows a cross-sectional view illustrative of forming a porous node in accordance with the present invention.

The HSG layer 124 is then etched back to define a plurality of cavities between grains of the HSG layer 124, thereby exposing the fourth dielectric layer 119 through the cavities 125, as shown in FIG. 5. The fourth dielectric layer 119 and the HSG layer 124 underlying the cavities 125 are then etched downward to form a porous storage node as shown in FIG. 6. Two dry etch processes are preferably employed to respectively etch the fourth dielectric layer 119 and the HSG layer 124 through the cavities 125 in the case, in order define a plurality of recessed holes extending from the surface into the storage node. In the preferred embodiments, the recessed holes can be defined to have a depth between about 300 to 3000 angstroms, thus the surface area of the storage node can be increased to raise the capacitance of the capacitor. During etch process, most of the grains on the surface of the fourth dielectric layer 119 and the third dielectric layer 114 are also removed. Note that the storage node in FIG. 6 is provided as an illustrative example, the shape of the node can be rectangular as shown, or in other shapes like a cylinder or an ellipse.

Figure 7:
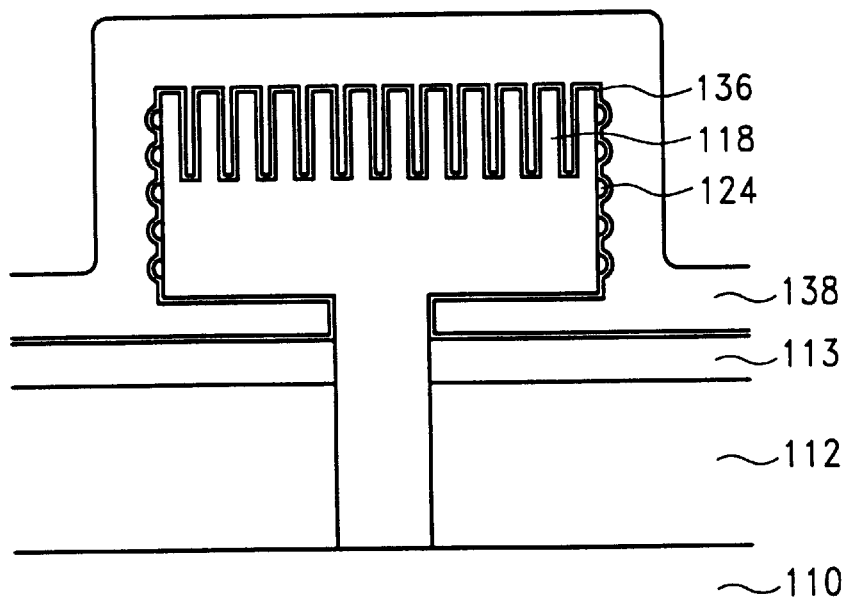
FIG. 7 shows a cross-sectional view illustrative of forming a DRAM capacitor in accordance with the present invention.

Turning to FIG. 7, the fourth oxide layer 119 and the third dielectric layer 114 are then removed. With the silicon oxide of the fourth oxide layer 119 and the third dielectric layer 114, they can be removed by a wet etch using buffered oxide etchant (BOE) or diluted hydrofluoric (HF) acid solution, preferably with the etch-stop layer of underlying second dielectric layer of silicon nitride. The whole porous node is then standing above the second dielectric layer 112 to provide increased surface area with the porous structure on top, grains on sidewalls, and exposed polysilicon surface at bottom.

A dielectric film 136 and a top electrode 138 of the DRAM cell capacitor can then be formed in the conventional manner. In this embodiment, a thin dielectric layer 136, such as stacked oxide-nitride-oxide (ONO) film, is formed conformably on the exposed surface of the bottom electrode (i.e., the storage node 118) and the surface of the second dielectric layer 113. As is known in the art of DRAM fabrication, the ONO film is reliable over shaped silicon surfaces, and is typically used as a capacitor insulator. The bottom oxide layer of the stacked oxide-nitride-oxide (ONO) film 136 is conventionally formed by thermally oxidizing the silicon surface, depositing an LPCVD silicon nitride layer and then oxidizing the silicon nitride layer to form the top oxide layer. Other material, such as nitride-oxide stacked film, $Ta_2O_5$, $TiO_2$, PZT, or BST can be used as the thin dielectric layer 136. A conductive layer 138 is then deposited over the stacked oxide/silicon nitride/oxide layer 136 to serve as an upper plate of the DRAM cell capacitor. Typically, the conductive layer 138 is a doped polysilicon layer formed in the same manner as the polysilicon layer 118.

As shown in FIG. 7, the capacitor for a dynamic random access memory cell of the present invention includes the storage node 118, a plurality of hemispherical silicon grains 124, the dielectric layer 136, and a the conductive layer 138. The storage node 118 is formed on the semiconductor substrate 110. The storage node 118 communicates to a conductive region on the semiconductor substrate 110 and has a porous structure on top. The hemispherical silicon grains 124 are formed on sidewalls of the storage node. The dielectric layer 136 covers the porous structure and the hemispherical silicon grains 124. The conductive layer 138 is formed on the dielectric layer 136 to serve as a second electrode.

Although specific embodiments have been illustrated and described, it will be obvious to those skilled in the art that various modifications may be made without departing from the spirit which is intended to be limited solely by the appended claims.

What is claimed is:

1. A method for forming a capacitor of a dynamic random access memory cell, said method comprising:

forming a first dielectric layer over a semiconductor substrate;

forming a second dielectric layer over said first dielectric layer;

forming a third dielectric layer over said second dielectric layer;

patterning said third dielectric layer, said second dielectric layer, and said first dielectric layer to have a contact hole within said third dielectric layer, said second dielectric layer, and said first dielectric layer;

forming a doped polysilicon layer within said contact hole and over said third dielectric layer;

forming a fourth dielectric layer over said doped polysilicon layer;

patterning said fourth dielectric layer and said doped polysilicon layer to define a storage node;

forming a hemispherical grained silicon layer on said fourth dielectric layer, on sidewalls of said storage node, and on said third dielectric layer;

etching said hemispherical grained silicon layer to define a plurality of cavities between grains of said hemispherical grained silicon layer and expose said fourth dielectric layer through said plurality of cavities;

etching said fourth dielectric layer and said doped polysilicon layer underlying said cavities to form a porous storage node;

removing said fourth dielectric layer and said third dielectric layer;

forming a fifth dielectric layer on said porous storage node and said substrate; and forming a conductive layer on said fifth dielectric layer.

2. The method according to claim 1, wherein said first dielectric layer comprises silicon oxide.

3. The method according to claim 1, wherein said second dielectric layer comprises silicon nitride.

4. The method according to claim 1, wherein said third dielectric layer comprises silicon oxide.

5. The method according to claim 1, wherein said fourth dielectric layer comprises silicon oxide.

6. The method according to claim 1, wherein said fifth dielectric layer comprises a stacked oxide-nitride-oxide (ONO) film.

7. The method according to claim 1, wherein said hemispherical grained silicon layer is formed using plasma enhanced chemical vapor deposition (PECVD) process.

8. The method according to claim 1, wherein said hemispherical grained silicon layer has a thickness between about 200 to 1000 angstroms.

9. The method according to claim 1, wherein the step of etching said hemispherical grained silicon layer to define said plurality of cavities is performed with dry etch.

10. The method according to claim 1, wherein the step of etching said fourth dielectric layer and said doped polysilicon layer to form a porous storage node is performed to define recessed holes of between 300 to 3000 in depth inside said doped polysilicon layer.

11. The method according to claim 1, wherein said conductive layer comprises a second doped polysilicon layer.

12. The method according to claim 1, wherein said fifth dielectric layer is selected from the group consisting of oxide-nitride, $Ta_2O_5$, $TiO_2$, PZT, and BST.

* * * * *